United States Patent
Freeman et al.

(10) Patent No.: US 9,240,354 B2
(45) Date of Patent: Jan. 19, 2016

(54) SEMICONDUCTOR DEVICE HAVING DIFFUSION BARRIER TO REDUCE BACK CHANNEL LEAKAGE

(71) Applicant: International Business Machines Corporation, Armonk, NY (US)

(72) Inventors: Gregory G. Freeman, Hopewell Junction, NY (US); Kam Leung Lee, Putnam Valley, NY (US); Chengwen Pei, Danbury, CT (US); Geng Wang, Stormville, NY (US); Yanli Zhang, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 198 days.

(21) Appl. No.: 13/676,412

(22) Filed: Nov. 14, 2012

(65) Prior Publication Data
US 2014/0131782 A1 May 15, 2014

(51) Int. Cl.
| | |
|---|---|
| *H01L 27/108* | (2006.01) |
| *H01L 21/84* | (2006.01) |
| *H01L 29/78* | (2006.01) |
| *H01L 21/265* | (2006.01) |
| *H01L 29/66* | (2006.01) |
| *H01L 27/12* | (2006.01) |
| *H01L 29/786* | (2006.01) |
| *H01L 29/06* | (2006.01) |

(Continued)

(52) U.S. Cl.
CPC .......... *H01L 21/84* (2013.01); *H01L 21/26506* (2013.01); *H01L 21/3247* (2013.01); *H01L 21/76243* (2013.01); *H01L 27/1087* (2013.01); *H01L 27/10873* (2013.01); *H01L 27/1203* (2013.01); *H01L 29/0623* (2013.01); *H01L 29/66181* (2013.01); *H01L 29/78* (2013.01); *H01L 29/78603* (2013.01); *H01L 29/78612* (2013.01); *H01L 29/78687* (2013.01); *H01L 29/78696* (2013.01); *H01L 21/26586* (2013.01)

(58) Field of Classification Search
CPC ....................................................... H01L 27/108
USPC ........... 257/301–304, 347–350; 438/151, 155
See application file for complete search history.

(56) References Cited

U.S. PATENT DOCUMENTS

| | | | | |
|---|---|---|---|---|
| 6,136,655 A | * | 10/2000 | Assaderaghi et al. | ........ 438/289 |
| 6,436,742 B2 | | 8/2002 | Miyamoto et al. | |

(Continued)

FOREIGN PATENT DOCUMENTS

| | | |
|---|---|---|
| JP | 04034976 | 2/1992 |
| JP | 2002016258 | 1/2002 |

(Continued)

OTHER PUBLICATIONS

International Search Report for related PCT Application No. PCT/US2013/066526, Feb. 24, 2014, pp. 1-3.

*Primary Examiner* — Marvin Payen
(74) *Attorney, Agent, or Firm* — Cantor Colburn LLP

(57) ABSTRACT

A semiconductor-on-insulator (SOI) substrate comprises a bulk semiconductor substrate, a buried insulator layer formed on the bulk substrate and an active semiconductor layer formed on the buried insulator layer. Impurities are implanted near the interface of the buried insulator layer and the active semiconductor layer. A diffusion barrier layer is formed between the impurities and an upper surface of the active semiconductor layer. The diffusion barrier layer prevents the impurities from diffusing therethrough.

8 Claims, 21 Drawing Sheets

(51) Int. Cl.
  *H01L 21/324* (2006.01)
  *H01L 21/762* (2006.01)

(56) References Cited

U.S. PATENT DOCUMENTS

| | | |
|---|---|---|
| 6,452,224 B1 | 9/2002 | Mandelman |
| 6,570,208 B2 | 5/2003 | Mandelman |
| 6,774,456 B2 | 8/2004 | Rusch |
| 7,608,506 B2 | 10/2009 | Cheng et al. |
| 7,663,189 B2 | 2/2010 | Fukuda |
| 2003/0160272 A1 | 8/2003 | Mandelman |
| 2005/0054156 A1 | 3/2005 | Bruley et al. |
| 2005/0285212 A1* | 12/2005 | Tolchinsky et al. ......... 257/408 |
| 2011/0156021 A1 | 6/2011 | Heo et al. |
| 2011/0291169 A1 | 12/2011 | Ervin et al. |
| 2012/0083080 A1 | 4/2012 | Shifren et al. |
| 2012/0086077 A1 | 4/2012 | Fried et al. |

FOREIGN PATENT DOCUMENTS

| | | |
|---|---|---|
| KR | 19990030078 A | 4/1999 |
| KR | 20010060037 A | 7/2001 |
| KR | 20110078596 A | 7/2011 |

\* cited by examiner

SEMICONDUCTOR DEVICE HAVING DIFFUSION BARRIER TO REDUCE BACK CHANNEL LEAKAGE

BACKGROUND

The present disclosure generally relates to a semiconductor device, and more specifically, to a semiconductor device having reduced back channel leakage.

Various conventional methods exist for reducing leakage current in the back gate channel of semiconductor devices fabricated on Semiconductor-on-Insulator (SOI) wafers. One technique referred to as "well implantation," applies an excessive amount of doped impurity such as boron for nFET and arsenic or phosphorus for pFET at specific regions of the back gate channel before forming the gate stack. Another technique referred to as "halo implantation," applies an excessive amount of doped impurity at specific regions of the back gate channel after performing a gate etching procedure.

These doped impurity atoms such as boron, however, may have a high diffusivity in semiconductor materials, such as silicon and diffuse to all place during thermal anneal in normal silicon process flow. As SOI thickness scaling continues to become thinner, it is more difficult to keep a retrograded doping profile, i.e., providing a higher doping concentration at the back channel region while maintaining a lower doping concentration at the surface channel region near front transistor gate. The lack of doping profile control raises the threshold voltage of the transistors, i.e., the front gate Vt, and degrades drive current which results in low device performance. It may be desirable to locate higher doping at the back channel region to suppress back channel leakage without realizing excessive diffusion at the front surface and without excessively increasing the transistor threshold voltage.

A leakage path typically forms at corners of the back gate channel. The leakage path causes a reduction in the voltage threshold at corresponding regions of the back gate channel, e.g., the corner of the back gate channel. As a result, the voltage threshold at the back gate channel may decrease. As the voltage threshold at the back gate channel decreases, the back gate channel may realize a partially conductive state, i.e., a parasitic gating phenomenon, thereby causing current to leak from the back gate channel via the leakage path and contribute a significant portion of leakage between the source and drain. Accordingly, operational characteristics of semiconductor devices may be controlled by reducing the occurrence of parasitic gating phenomenon.

SUMMARY

According to at least one embodiment of the present disclosure, a method of fabricating a semiconductor device comprises implanting impurities to a optimized depth within an active semiconductor layer formed on a buried insulator layer of a semiconductor-on-insulator (SOI) substrate. The method further includes forming a diffusion barrier by implant second impurities in the active semiconductor layer. The impurities to form diffusion barrier is implanted between the impurities and an upper surface of the active semiconductor layer. The method further includes annealing the diffusion barrier material to form a diffusion barrier layer that prevents the first implanted impurities from diffusing therethrough.

According to another embodiment of the disclosure, a method of reducing leakage from a gate channel region of a semiconductor device comprises forming first and second trenches through an active semiconductor layer and a buried insulator layer of a semiconductor-on-insulator (SOI) substrate. The first and second trenches define a gate channel region therebetween. The method further includes depositing impurities in at least one leakage region within the active semiconductor layer of the gate channel region, and forming a diffusion barrier layer between the impurities and an upper surface of the gate channel region. The diffusion barrier layer prevents the impurities from diffusing therethrough such that a voltage threshold at the at least one leakage region is increased.

In yet another embodiment of the disclosure, a semiconductor memory device comprises a semiconductor-on-insulator (SOI) substrate including an active semiconductor layer formed on a buried insulator layer. A semiconductor device is formed on the SOI substrate, and includes a gate channel region formed between a source region and a drain region. At least one storage element is formed adjacent the gate channel region, and at least one isolation region is disposed between the gate channel region and the at least one storage element. First impurities are implanted near the interface of the active semiconductor layer and buried oxide near the gate channel region. For example, impurities such as boron may be utilized for an nFET device, and phosphorus for a pFET device. The first impurities adjust back channel threshold voltage to reduce the back channel leakage. Second impurities including at least one of nitrogen and carbon form a diffusion barrier that is implanted at a peak position located between the first implanted layer and surface channel such that the semiconductor memory device includes a diffusion barrier layer formed in the active semiconductor layer. The diffusion barrier layer is formed by the second implanted impurities with anneal to increase a voltage threshold at a region shared by the BOX layer, the back gate channel region, and the at least one isolation region.

In still another embodiment of the disclosure, a semiconductor-on-insulator (SOI) substrate comprises a bulk semiconductor substrate having a buried insulator layer formed thereon. The SOI substrate further includes an active semiconductor layer disposed on the buried insulator layer. A layer of impurities is formed within the active semiconductor layer. The SOI substrate further includes a diffusion barrier layer formed between the impurities and an upper surface of the active semiconductor layer. The barrier diffusing layer blocks the impurities from diffusing therethrough.

Additional features and utilities may be realized through the various embodiments described in the detailed description. Further, other embodiments and utilities of the disclosure are described in detail herein and are considered a part of the claimed embodiments. For a better understanding of the subjected matter and related features, refer to the following description and accompanying drawings.

BRIEF DESCRIPTION OF THE SEVERAL VIEWS OF THE DRAWINGS

The subject matter of the various embodiments is particularly pointed out and distinctly claimed in the claims at the conclusion of the specification. The forgoing and other features of the disclosure are apparent from the following detailed description taken in conjunction with the accompanying drawings. FIGS. 1-6 are a series of views illustrating a method of forming a semiconductor device according to embodiments of the disclosure, in which:

FIG. 1 illustrates a cross-sectional view of a semiconductor-on-insulator (SOI) starting substrate;

FIG. 2 illustrates implantation of impurities into an active semiconductor layer of the SOI substrate shown in FIG. 1;

FIG. 3 illustrates implantation of atoms to form a diffusion barrier into the active semiconductor layer of the SOI substrate shown in FIG. 2;

FIG. 4 illustrates an annealing process applied to the diffusion barrier material of the SOI substrate shown in FIG. 3;

FIG. 5 illustrates a diffusion barrier layer formed between impurities and an upper portion of an active semiconductor layer following an annealing process performed on the SOI substrate shown in FIG. 4; and FIG. 6 illustrates the SOI substrate of FIG. 5 following formation of a semiconductor device, a storage element and an isolation element.

FIGS. 7-13 are a series of views illustrating another method of forming a semiconductor device according to embodiments of the disclosure, in which:

FIG. 7 illustrates a cross-sectional view of a semiconductor-on-insulator (SOI) starting substrate;

FIG. 8 illustrates a plurality of isolation trenches, a plurality of storage trenches, and a channel region located between the isolation trenches following etching of the SOI substrate shown in FIG. 7;

FIG. 9 illustrates deposition of impurities into the active semiconductor layer of the gate channel region included with the SOI substrate shown in FIG. 8;

FIG. 10 illustrates deposition of a diffusion barrier material into the active semiconductor layer of the gate channel region included with the SOI substrate shown in FIG. 9;

FIG. 11 illustrates an annealing process applied to the diffusion barrier material of the SOI substrate shown in FIG. 10;

FIG. 12 illustrates a diffusion barrier layer formed between impurities and an upper portion of a gate channel region following an annealing process performed on the SOI substrate shown in FIG. 11; and FIG. 13 illustrates formation of isolation elements and storage elements in the SOI substrate shown in FIG. 12.

FIGS. 14-19 are a series of views illustrating yet another method of forming a semiconductor device according to embodiments of the disclosure, in which:

FIG. 14 illustrates a cross-sectional view of a silicon-on-insulator (SOI) starting substrate following formation of a plurality of isolation trenches, a plurality of storage trenches, and a gate channel region between the isolation trenches;

FIG. 15 illustrates deposition of impurities at leakage regions of a gate channel region included in the SOI substrate shown in FIG. 14;

FIG. 16 illustrates deposition of a diffusion barrier material into an active semiconductor layer of the gate channel region included with the SOI substrate shown in FIG. 15;

FIG. 17 illustrates an annealing process applied to the diffusion barrier material of the SOI substrate shown in FIG. 16;

FIG. 18 illustrates a diffusion barrier layer formed between impurities and an upper portion of a gate channel region following an annealing process performed on the SOI substrate shown in FIG. 17; and FIG. 19 illustrates formation of isolation elements and storage elements in the SOI substrate shown in FIG. 18.

DETAILED DESCRIPTION

Figure 1:
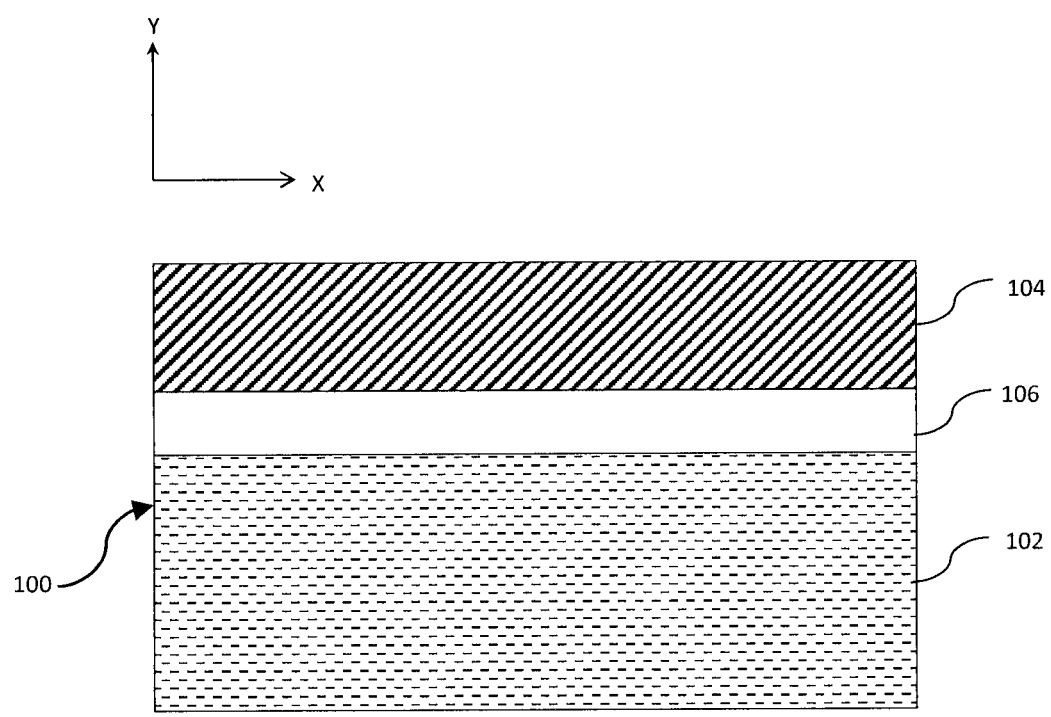

With reference to FIG. 1, a starting semiconductor-on-insulator, such as a silicon-on-insulator (SOI) substrate 100 is illustrated. The SOI substrate 100 may extend along an X-axis to define a length, and a Y-axis perpendicular to the X-axis to define a width. The SOI substrate 100 includes a bulk substrate layer 102 and an active semiconductor layer 104. The bulk substrate layer 102 and active semiconductor layer 104 may be formed from a semiconductor material such as, for example, silicon (Si). The bulk substrate layer 102 may have a width of about 90 nanometers (nm) to about 200 nm. The active semiconductor layer 104 may have a width of about 30 nm to about 200 nm. The SOI substrate 100 further includes a buried insulator layer, such as a buried oxide (BOX) layer 106 for example, formed between the bulk substrate layer 102 and the active semiconductor layer 104. The BOX layer 106 may comprise, for example, silicon oxide ($SiO_2$) to isolate the active semiconductor layer 104 from the bulk substrate layer 102.

Figure 2:
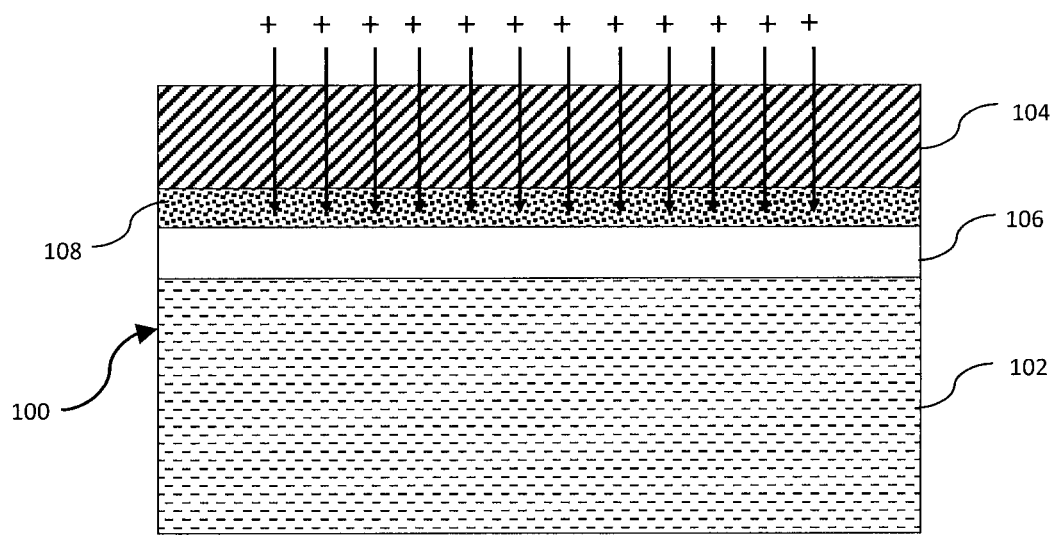

Referring now to FIG. 2, impurities 108 may be deposited in the active semiconductor layer 104 of the SOI substrate. In at least one embodiment of the disclosure, for example, the impurities 108 are implanted in the active semiconductor layer 104 and substantially near an interface shared between the BOX layer 106 and the active semiconductor layer 104. The impurities 108 may be implanted at selected locations in the active semiconductor layer 104, or may continuously extend across the entire length of the active semi semiconductor layer 104. In at least one embodiment, the impurities 108 are implanted to form a layer of impurities 108 having a width ranging from about 40 nm to about 80 nm. The impurities 108 may be selected according to the type of semiconductor device to be fabricated. For example, the impurities 108 may include, but are not limited to, boron (B), boron difluoride ($BF_2$) and gallium (Ga), if the semiconductor device is an n-type field effect transistor (FET). In another embodiment, the impurities 108 may include, but are not limited to, arsenic (As) and phosphorous (P), if the semiconductor device is a p-type FET.

Figure 3:
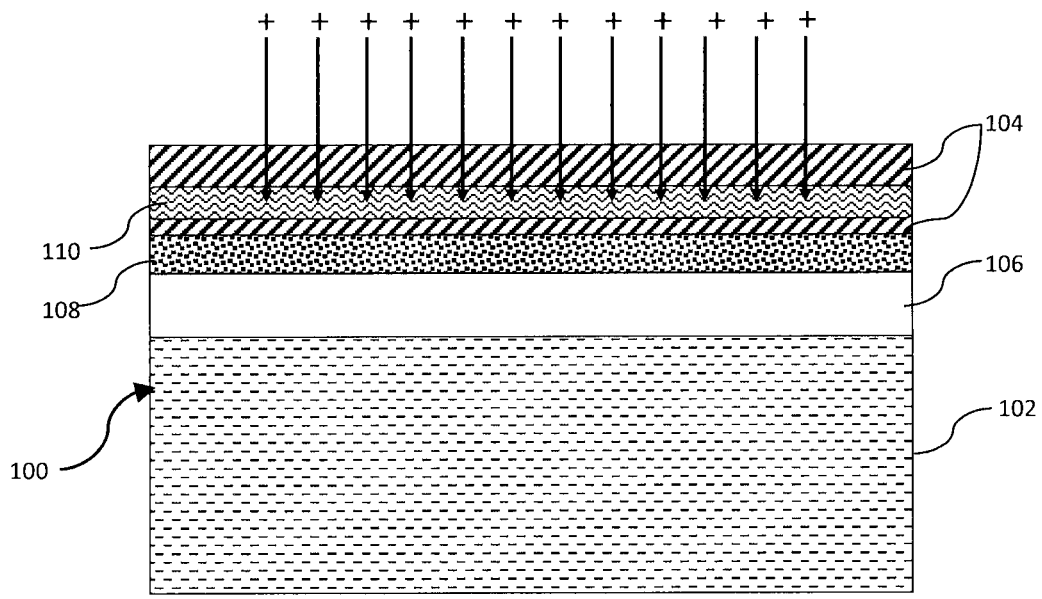

Referring now to FIG. 3, a diffusion barrier material 110 is implanted into the active semiconductor layer 104 of the SOI substrate 100. The diffusion barrier material 110 may include, for example, nitrogen, carbon, indium, and gallium. Alternatively, the diffusion barrier may include germanium and xenon. According to still a further embodiment, the diffusion barrier material 110 may include a combination of indium, gallium, nitrogen and carbon. For example, the barrier diffusion material 110 may comprise a combination of indium and nitrogen.

Figure 4:
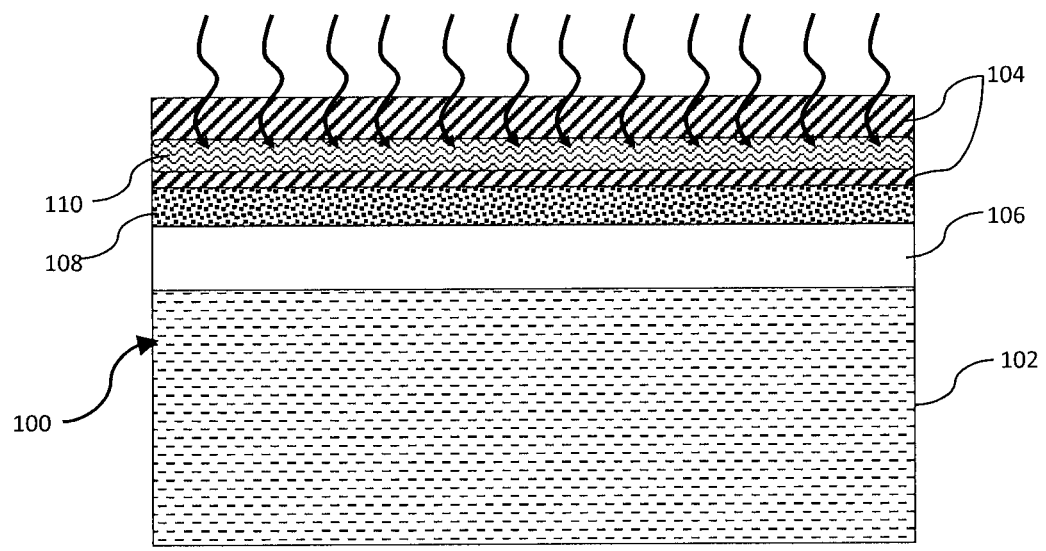
Figure 5:
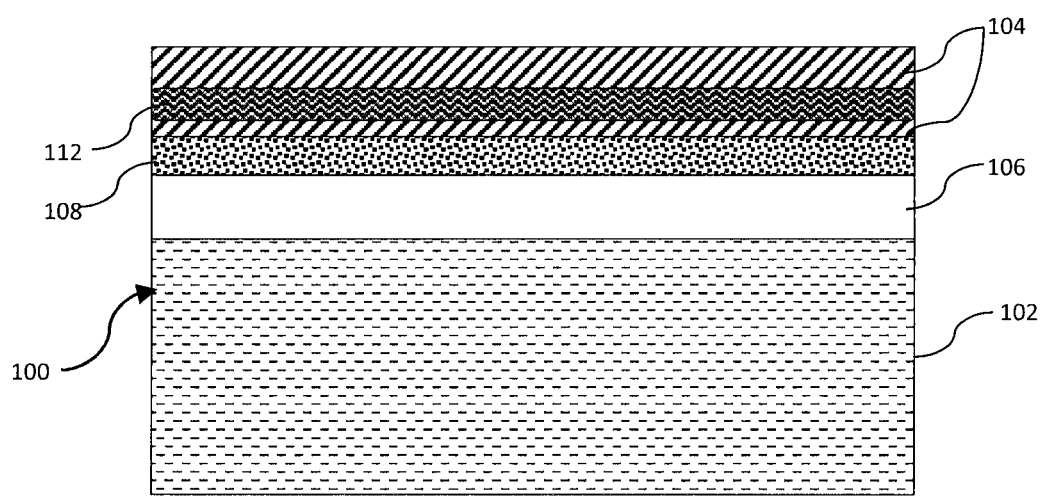

The diffusion barrier material 110 may be annealed according to a heating process for example, as illustrated in FIG. 4, which forms a diffusion barrier layer 112 between the implanted impurities 108 and an upper surface of the active semiconductor layer 104 as further illustrated in FIG. 5. The diffusion barrier layer 112 prevents the impurities 108 from diffusing therethrough. That is, the diffusion barrier layer 112 prevents the impurities 108 from diffusing toward an upper surface of the active semiconductor layer 104, and instead maintains the impurities 108 at a desired region in the active semiconductor layer 104. The diffusion barrier layer 112 may have a width ranging from about 40 nm to about 80 nm. In at least one embodiment, the diffusion barrier layer 112 has a peak position at about the middle of the active semiconductor layer 104. Further, the diffusion barrier layer 112 may extend across the length of the active semiconductor layer 112. However, the formation of diffusion barrier layer 112 is not limited thereto. As a result, an increased $V_t$ may be maintained at a desired implantation region of the active semiconductor layer 104 where the impurities 108 are deposited, as discussed in greater detail below.

Figure 6:
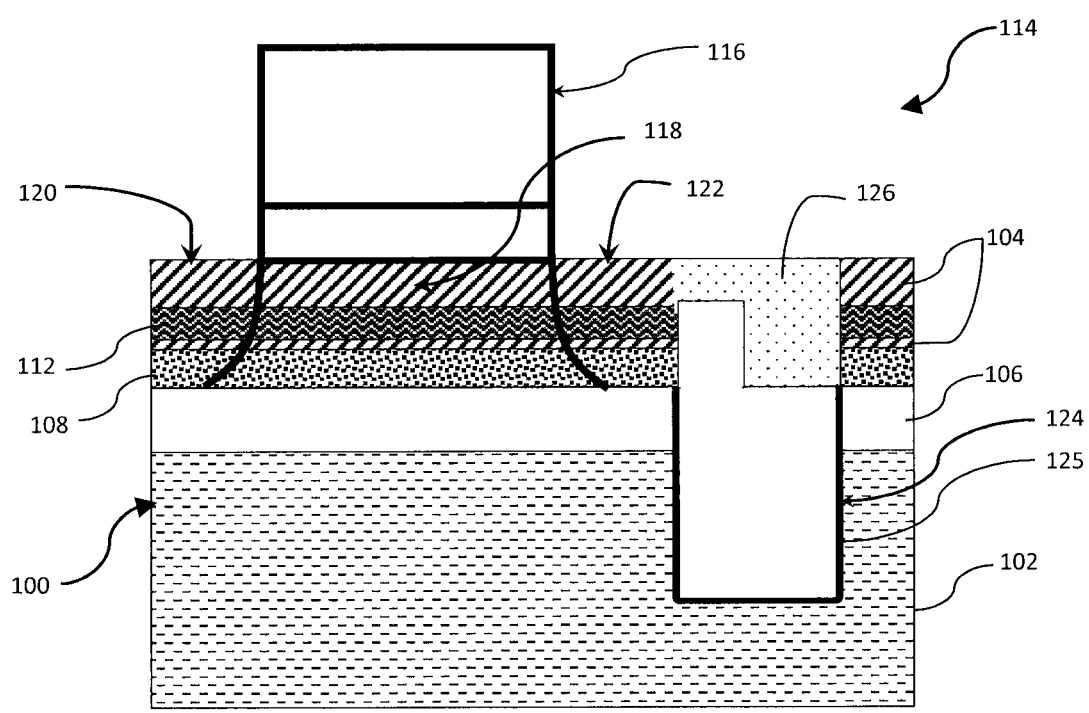

The SOI substrate 100 having the diffusion barrier layer 112 may be utilized to form one or more semiconductor components, as illustrated in FIG. 6. In at least one embodiment, the semiconductor component is a semiconductor memory device 114. The semiconductor memory device 114 may include, for example, an embedded dynamic random-access memory (eDRAM) cell. It can be appreciated that the eDRAM cell may be included in an eDRAM array device having a plurality of eDRAM cells.

The semiconductor memory device 114 may include a SOI substrate 100 having an active semiconductor layer 104 formed on a BOX layer 106 as further illustrated in FIG. 6. A semiconductor device 116, such as a field effect transistor (FET) for example, may be formed on the active semiconductor layer 104 of the SOI substrate 100. The semiconductor memory device 114 includes a gate channel region 118 formed between a source region 120 and a drain region 122. At least one storage element 124 is formed adjacent the gate channel region 118. The storage element 124 may include, for example, a capacitor. A spacer 125 may be formed on one or more inner surfaces of the storage element. The spacer 125 may comprise, for example, nitride. At least one isolation element 126 is disposed between the gate channel region 118 and the at least one storage element 124.

The semiconductor memory device 114 further includes impurities 108 disposed at an implantation region within the active semiconductor layer 104 of the gate channel region 118. The implantation region may be located, for example, at a region of the gate channel region 118 shared by the active semiconductor layer 104, the BOX layer 106 and an isolation element 126. Further, a diffusion barrier layer 112 is formed between the impurities 108 and an upper surface of the gate channel region 118. The diffusion barrier layer 112 prevents the impurities 108 from diffusing therethrough such that the impurities 108 are substantially maintained at the implantation region. Accordingly, a semiconductor memory device 114 according to an embodiment of the disclosure may realize a reduction of current leakage in the gate channel region 118.

Referring now to FIGS. 7-13, a series of illustrations shows a process flow of fabricating a semiconductor device such as, for example, a high density dynamic memory device 128 according to an embodiment of the disclosure. The high density dynamic memory device 128 may include, but is not limited to, an eDRAM device.

Figure 7:
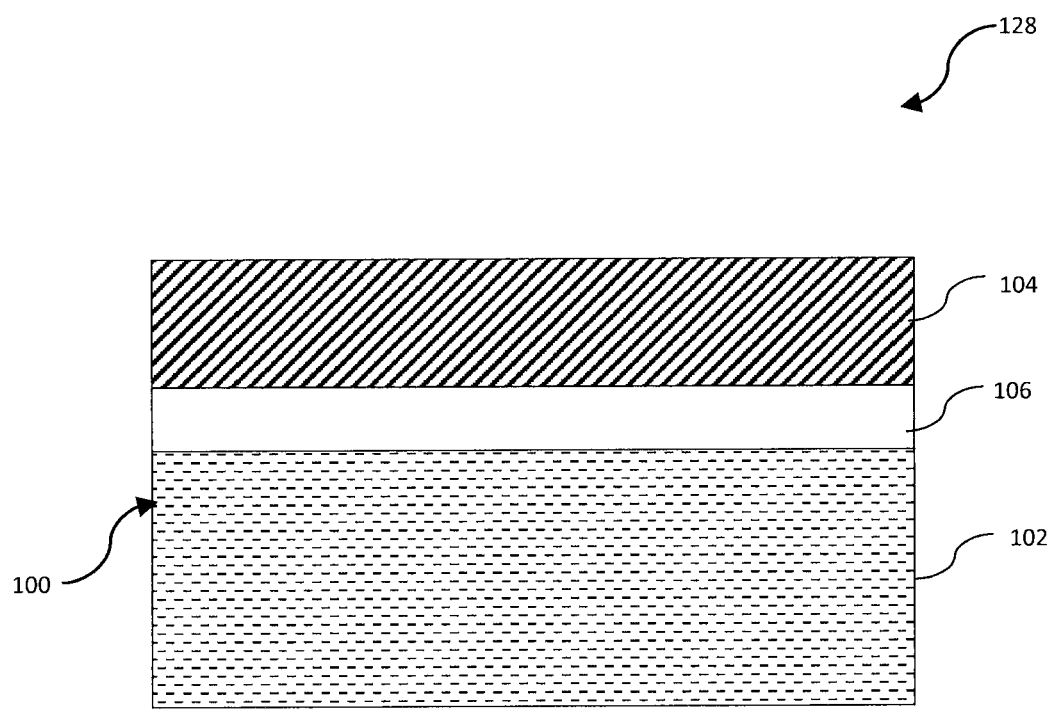
Figure 8:
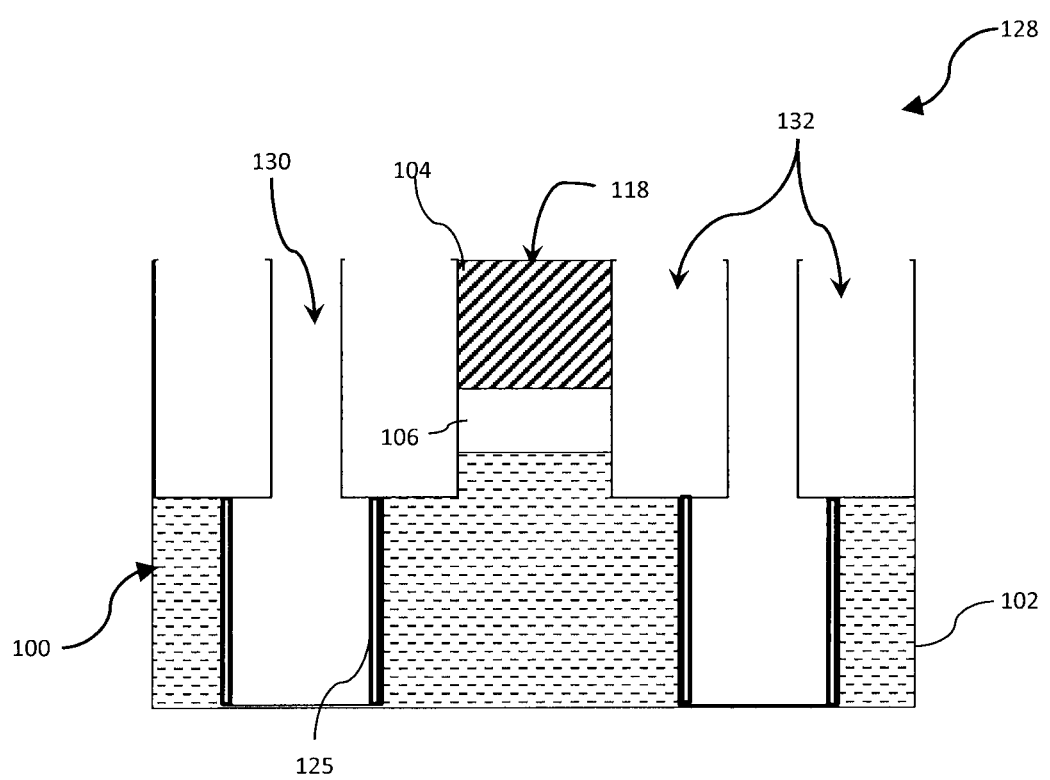

With respect to FIG. 7, a SOI substrate 100 includes a bulk substrate 102, an active semiconductor layer 104 and a BOX layer 106 disposed between the bulk substrate 102 and the active semiconductor layer 104. The SOI substrate 100 may be etched to form one or more storage trenches 130 and one or more isolation trenches 132, as illustrated in FIG. 8. The storage trenches 130 may be formed by masking and performing a multi-step etching process on the active semiconductor layer 104, the BOX layer 106 and the bulk substrate 102 to a desired depth in the bulk substrate 102. Various methods may be used to form the storage trench 130 including, but not limited to, reactive-ion etching (RIE). The isolation trenches 132 may be formed in the SOI substrate 100 to intersect the active semiconductor layer 104 and the BOX layer 106. Further, a gate channel region 118 may be defined between adjacent isolation trenches 132, as further illustrated in FIG. 8.

Figure 9:
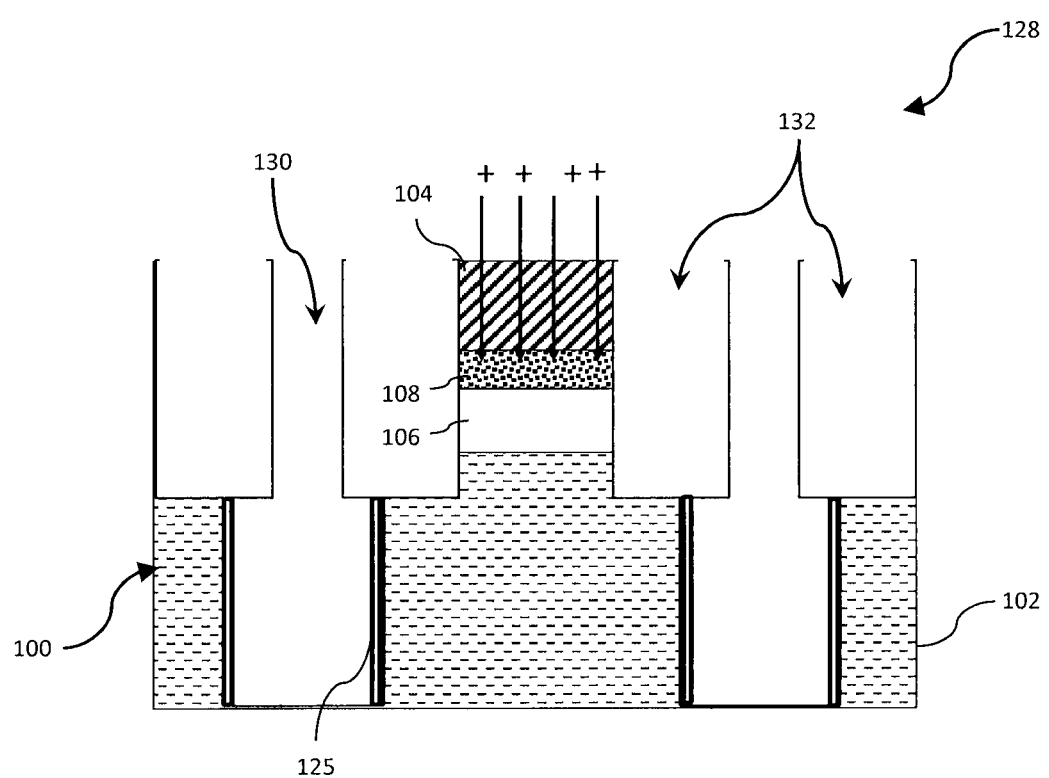
Figure 10:
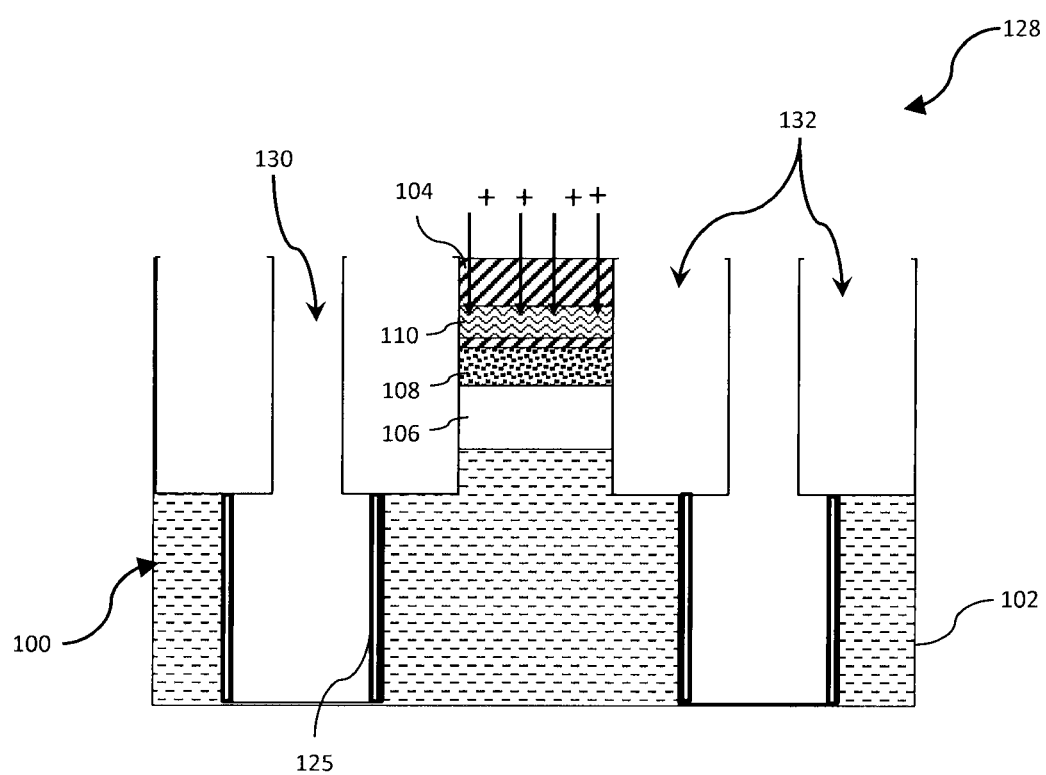
Figure 11:
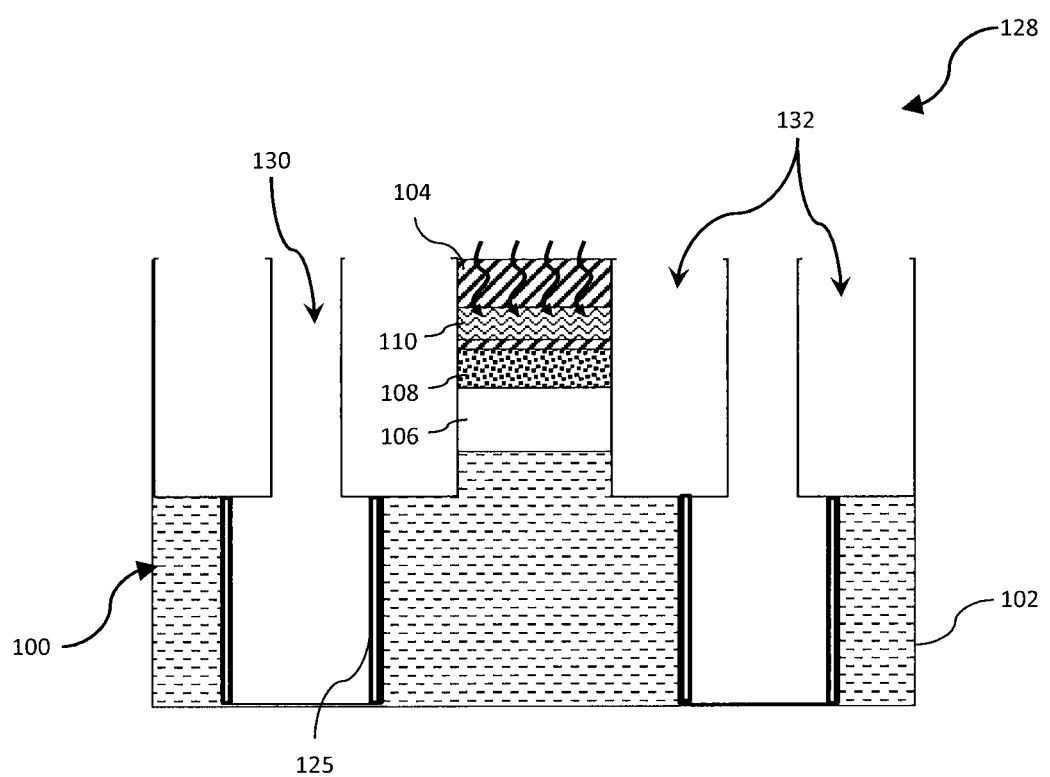
Figure 12:
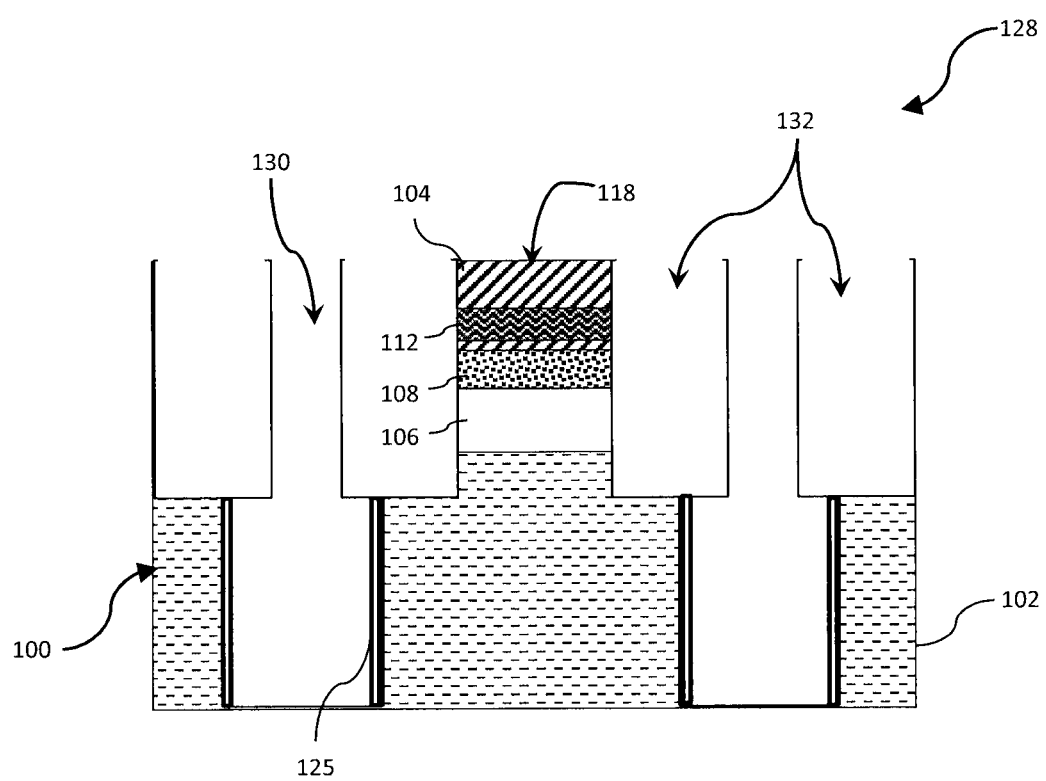

Similar to the procedures described in detail above, impurities 108 may be deposited in an active semiconductor layer 104 of the gate channel region 118 as illustrated in FIG. 9. A diffusion barrier material 110 may be deposited in the active semiconductor layer 104 as illustrated in FIG. 10. The diffusion barrier material 110 may be annealed to form a diffusion barrier layer 112 in the active semiconductor layer 104 between the impurities 108 and an upper portion of the gate channel region 118, as illustrated in FIGS. 11-12. In at least one embodiment of the disclosure, the diffusion barrier layer 112 may extend across a length of the gate channel region 118. Further, according to at least one embodiment the diffusion barrier layer 112 extends the entire length of the gate channel region 118 defined by opposing isolation elements 126.

Figure 13:
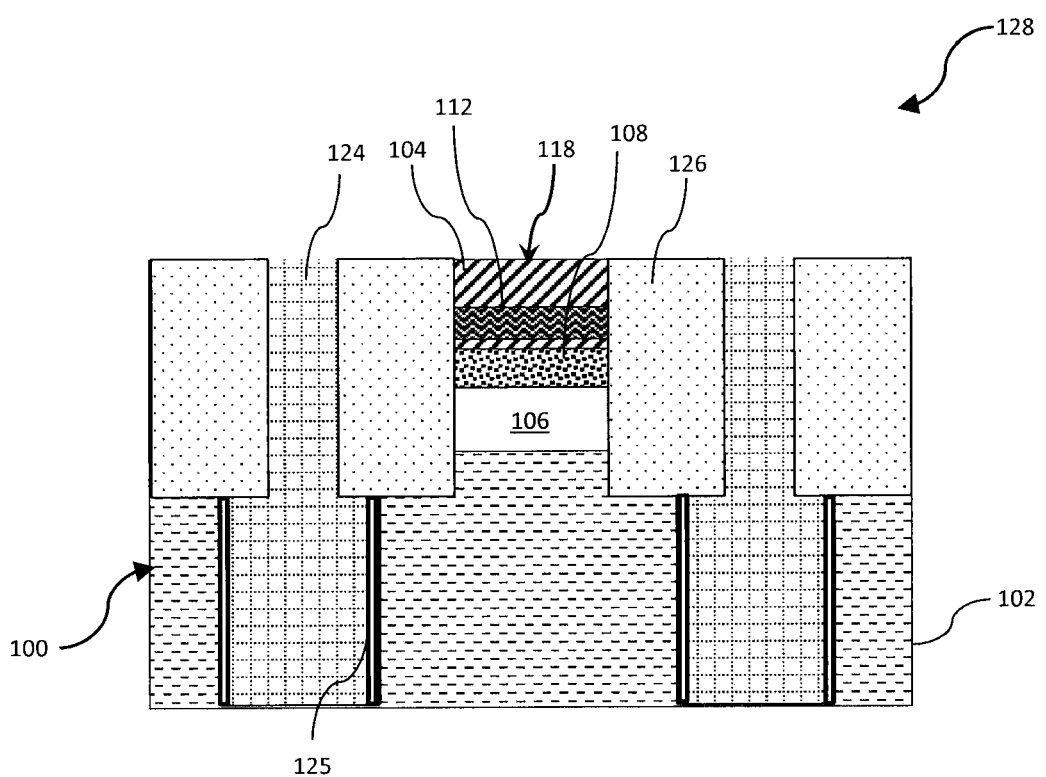

One or more storage trenches 130 may be filled with a dielectric material such as, for example, silicon oxide ($SiO_2$) or silicon nitride ($Si_3N_4$), to form a storage element 124 as illustrated in FIG. 13. The storage element 124 may include spacers 125 formed from nitrite, for example, which isolate the storage element 124 from the bulk substrate 102 and/or the BOX layer 106. The storage element 124 includes, but is not limited to, a capacitor. The isolation trench 132 may be filled with a dielectric material such as, for example, $SiO_2$ thereby electrically isolating the gate channel region 118 as further illustrated in FIG. 13. Accordingly, a semiconductor memory device 128 may be provided including a diffusion barrier layer 112 formed in the gate channel region 118.

As discussed in detail above, the diffusion barrier layer 112 may prevent the impurities 108 from diffusing therethrough such that an increased $V_t$ at a desired region of the gate channel region 118 is maintained and a current leakage is reduced. More specifically, an increased stored charge density may form in the bulk substrate 102 due to a hole charge (or electron charge in the case of a p-type semiconductor device) stored in the storage elements 124. One or more storage elements 124 may be formed in substantial alignment with one side of the gate channel region 118, and the increased stored charge density may form where the side of the gate channel region 118 and the side of the storage element 124 are in proximity of one another. This increase in charge density induces an increase in electron density in the active semiconductor layer 104, also in substantial alignment with the gate channel region 118. The charge density may occur, for example, in a lower portion of the gate channel region 118 remote from an upper surface of the gate channel region 118 where an applied voltage is less effective to control electron density. Consequently, the increase in electron density may form a leakage region, i.e., leakage path, in the gate channel region 118. For example, the leakage region may be formed at a portion of the gate channel region 118 shared by the active semiconductor layer 104, the BOX layer 106 and an isolation element 126.

Moreover, the increase in electron density causes a reduction in the $V_t$ at the lower portion of the gate channel region 118. As a result, the $V_t$ at the lower portion of the gate channel region 118, i.e., the back gate voltage threshold $V_{tb}$, may fall below the voltage threshold of the upper portion of the gate channel region 118, i.e., $V_{tu}$ which may be held very low, for example, from about zero volts to about one-half of a negative power supply voltage. As the $V_{tb}$ falls below the $V_{tu}$, the lower portion of the gate channel region may realize a partially conductive state, i.e., a parasitic gating phenomenon, thereby causing current to leak from the gate channel region 118 via the leakage region.

The implantation of the impurities 108 within the active semiconductor layer 104 may increase the $V_t$ at a desired region of the active semiconductor layer 104 such as, for example, a leakage region. Accordingly, the $V_t$ at the leakage region of the gate channel region 118 may be increased, while the $V_t$ near the surface of the active semiconductor layer 104 may remain at a level preselected as a desired $V_t$ for a particular semiconductor device design. However, various conditions such as heat, for example, may cause the impurities 108 implanted within the active semiconductor layer 104 to diffuse. Consequently, the impurities 108 may diffuse away from the desired implantation region, for example the leakage region, and may travel toward the upper surface of the active semiconductor layer 104, i.e., the upper surface of the gate channel region 118. The diffusion barrier layer 112, however, inhibits the impurities 108 from diffusing away from a desired implantation region. That is, the impurities 108 are blocked by the diffusion barrier layer 112 from diffusing to an upper surface of the active semiconductor layer 104 of the gate channel region 118. Instead, the impurities 108 are maintained at the desired implantation region in the active semiconductor layer 104 such that the increased $V_t$ at the desired region, such as the leakage region, of the active semiconductor layer 104 is maintained. Accordingly, the parasitic gating phenomenon is prevented and leakage from the gate channel region 118 is reduced. Moreover, the diffusion barrier layer 112 allows fabrication of a semiconductor device 128 where the voltage threshold at a lower portion of the gate channel region, i.e., $V_{tb}$, may be controlled independently from the voltage threshold at an upper portion of the gate channel region, i.e., $V_{tu}$.

Figure 14:
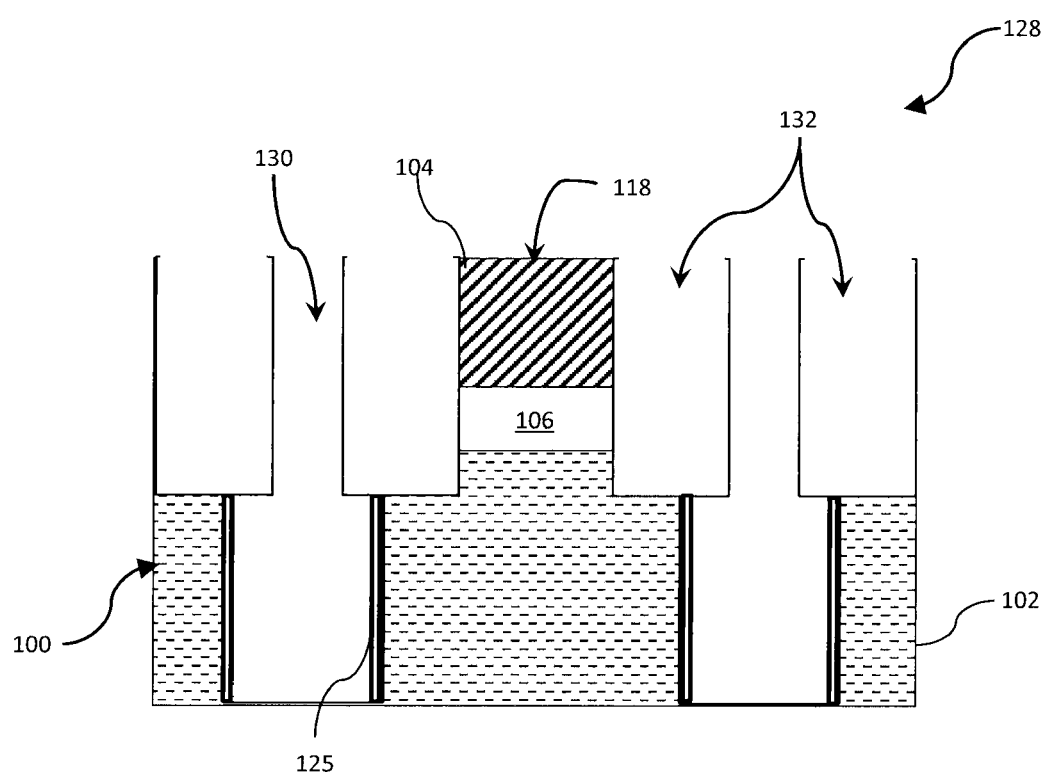
Figure 15:
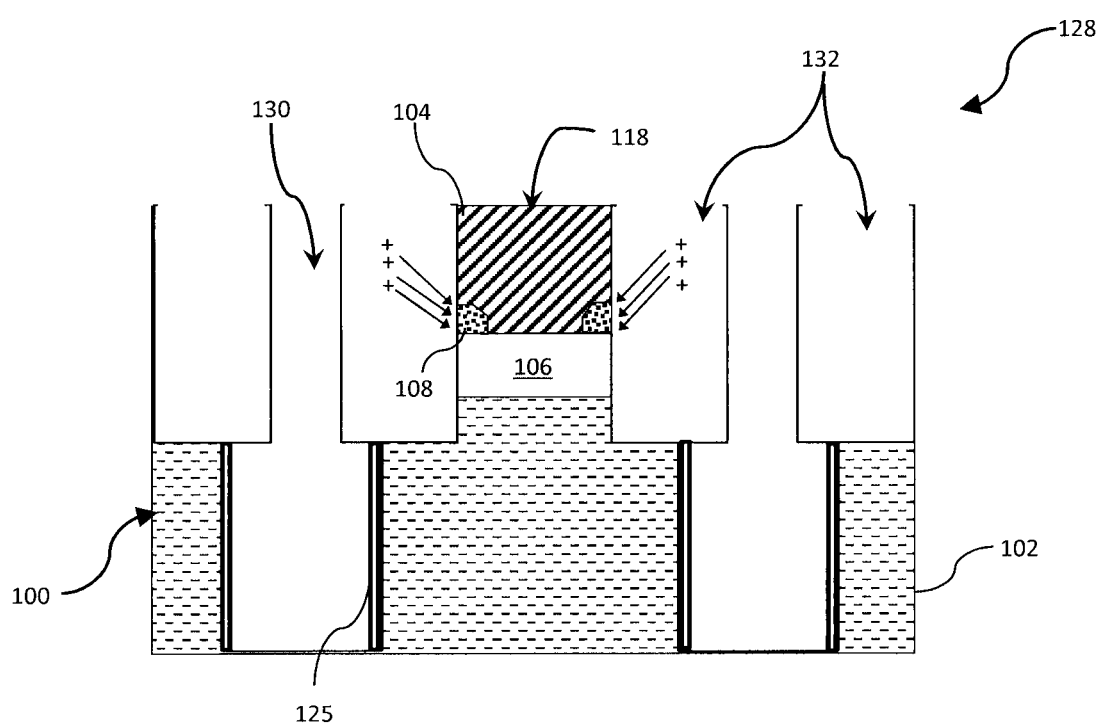

A semiconductor device 128 including a diffusion barrier layer 112 formed in the gate channel region 118 may be fabricated according another embodiment illustrated in FIGS. 14-19. Referring to FIG. 14, an SOI substrate 100 may be etched to form one or more storage trenches 130 and one or more isolation trenches 132 as discussed in detail above. Impurities 108 may be implanted at one or more desired regions in the active semiconductor layer 104 of the gate channel region 118, as illustrated in FIG. 15. In at least one embodiment, the impurities 108 may be disposed at one or more corners of the active semiconductor substrate 104 corresponding to the gate channel region 118 via an isolation trench 130 as further illustrated in FIG. 15.

Figure 16:
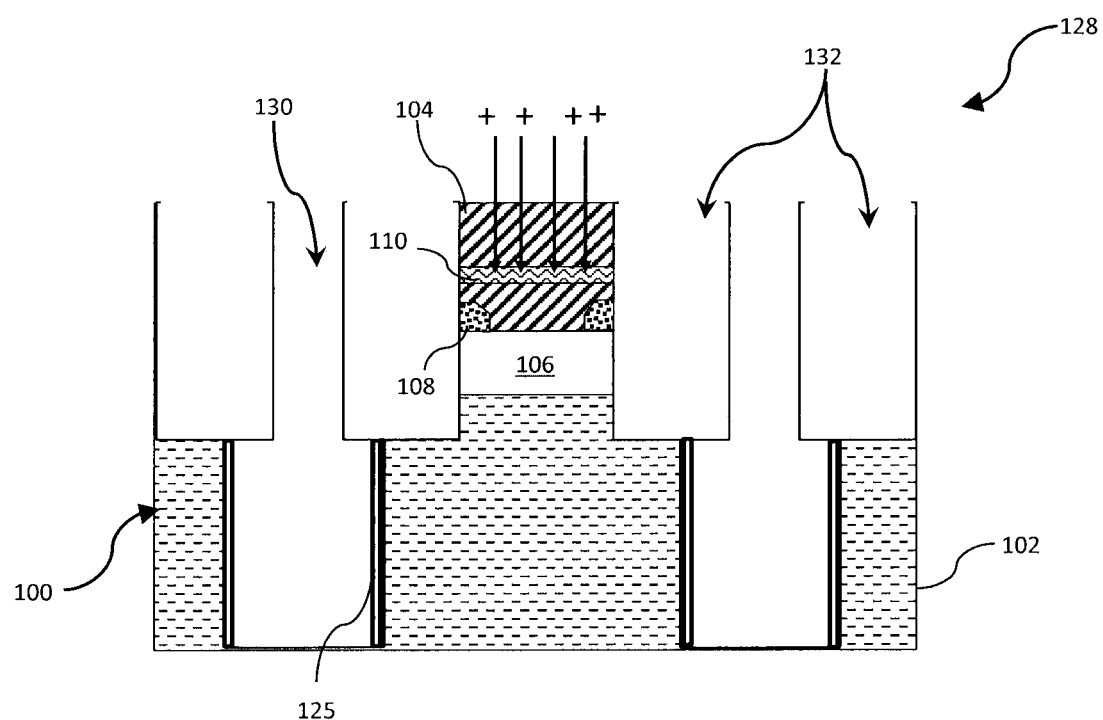
Figure 17:
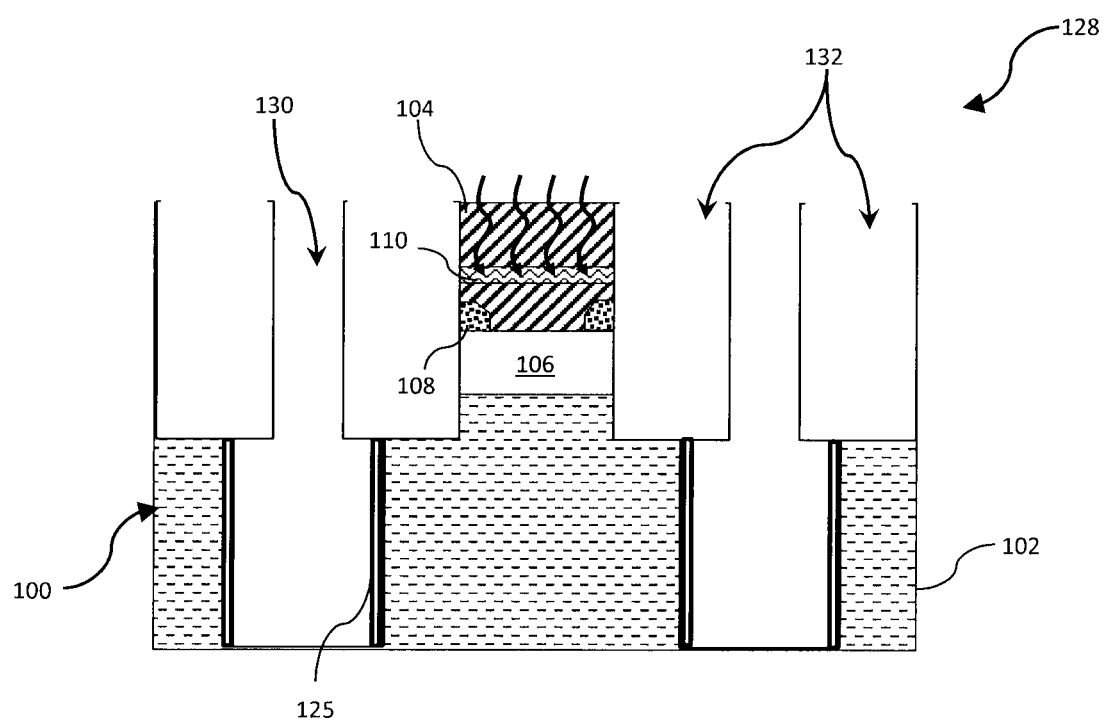
Figure 18:
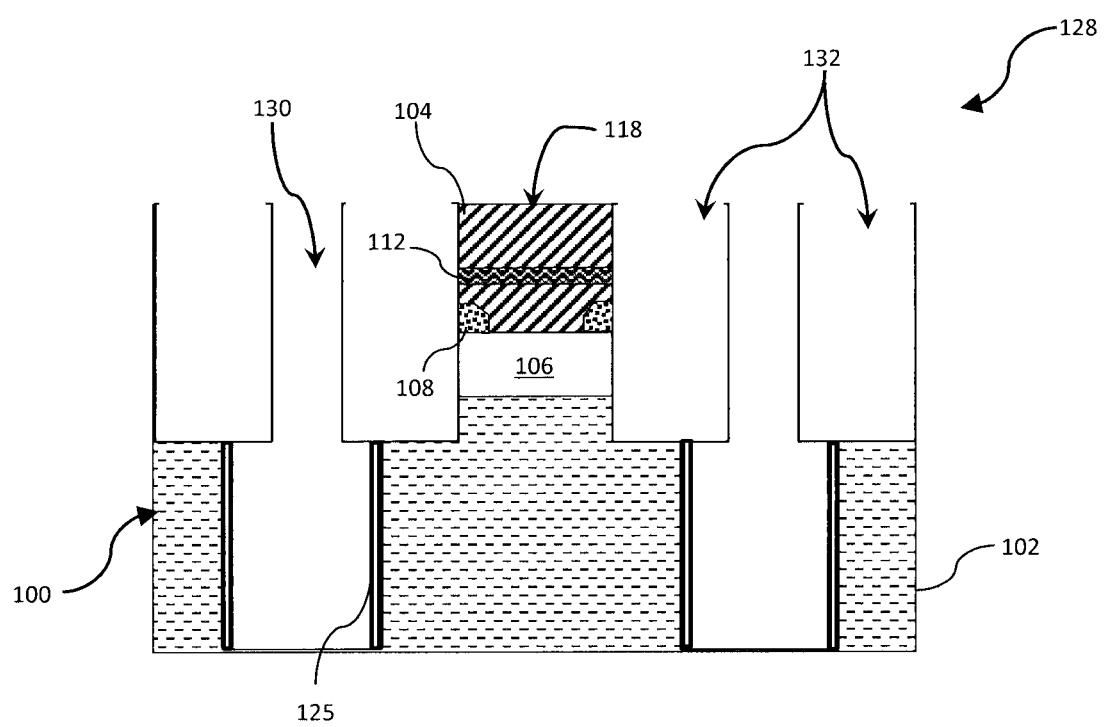

Referring to FIG. 16, a diffusion barrier 110 may be formed by implanting at least one of nitrogen and carbon, but not limited to thereto, in the active semiconductor layer 104 of the gate channel region 118. The diffusion barrier material 110 may undergo an annealing process to form a diffusion barrier layer 112, as illustrated in FIGS. 17 and 18. In at least one exemplary embodiment, the diffusion barrier layer 112 is disposed between the impurities 108 and an upper portion of the active semiconductor layer 104. Further, the diffusion barrier layer 112 may extend across a length of the gate channel region 118. In at least one embodiment, for example, the diffusion barrier layer 112 extends across the entire length of the gate channel region 118.

Figure 19:
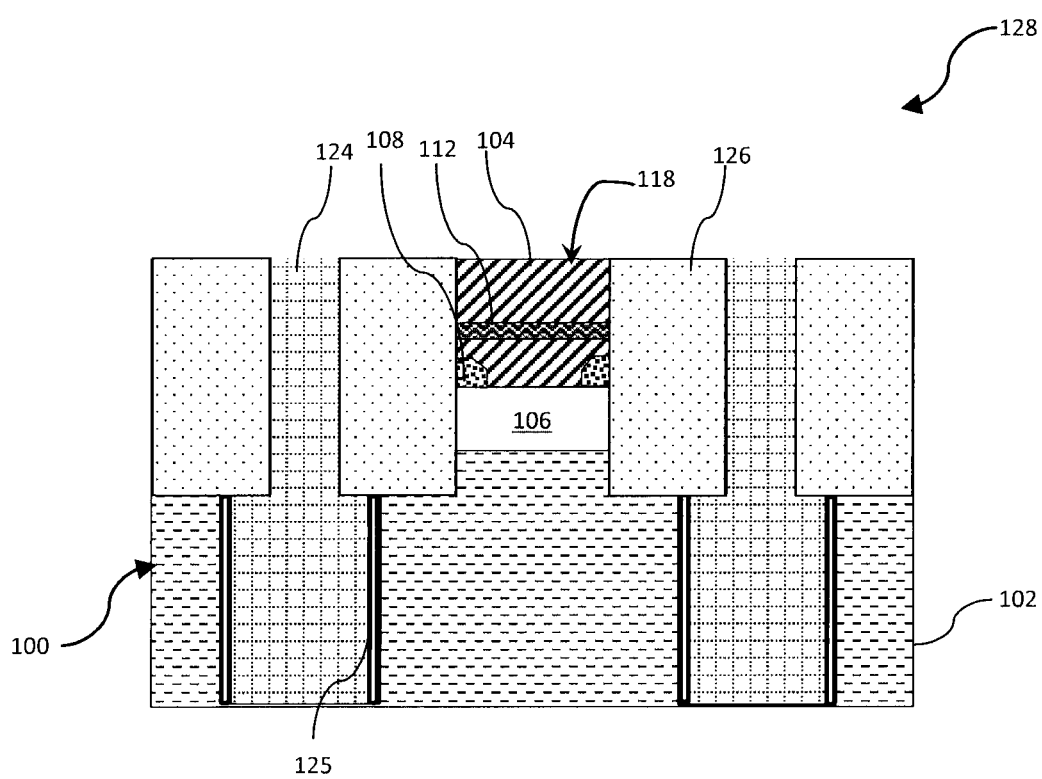

Referring now to FIG. 19, storage elements 124 and isolation elements 126 may be formed in the storage trenches 130 and isolation trenches 132, respectively. The storage trenches 130 may be filled with a dielectric material such as, for example, silicon oxide ($SiO_2$) or silicon nitride ($Si_3N_4$). The isolation trenches 132 may be filled with a dielectric material such as, for example, $SiO_2$ to electrically isolate the gate channel region 118. Accordingly, the impurities 108 may be maintained at the desired implantation areas of the gate channel region 118, such as the lower corners of the active semiconductor layer 104 corresponding to the gate channel region 118 as illustrated in FIG. 19. By maintaining the impurities 108 at the lower corners, an increased $V_t$ at the corners may be maintained, thereby preventing current from leaking from the gate channel region 118 into the isolation elements 126.

Figure 20:
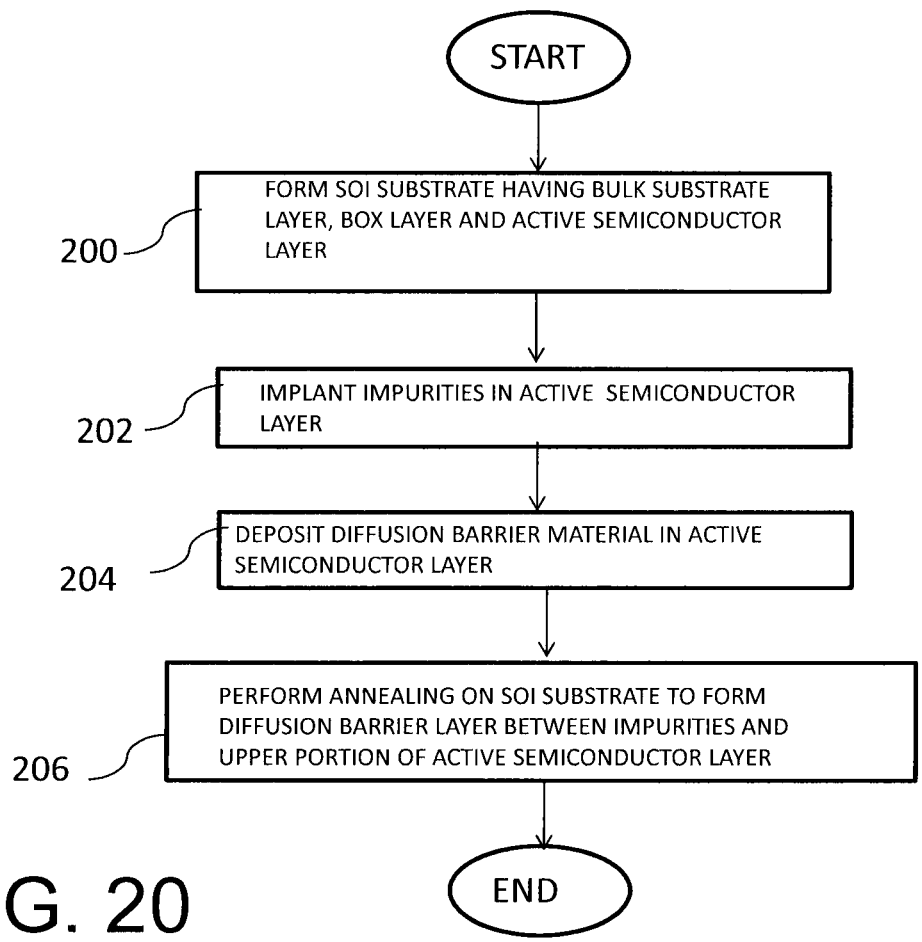
FIG. 20 is a flow diagram illustrating a method of fabricating a SOI substrate including impurities and a diffusion barrier layer.

Referring now to FIG. 20, a flow diagram illustrates a method of fabricating a SOI substrate including impurities and a diffusion barrier layer. At operation 200, an SOI substrate is formed having a bulk substrate layer, a BOX layer and an active semiconductor layer. The BOX layer is formed between the bulk substrate layer and the active semiconductor layer. The bulk substrate layer and the active semiconductor layer may be formed from silicon, for example, and the BOX layer may comprise, for example, $SiO_2$. At operation 202, impurities are implanted in the active semiconductor layer. In at least one embodiment, the impurities are implanted substantially near an interface shared between the active semiconductor layer and the BOX layer. At operation 204, a diffusion barrier material is deposited in the active semiconductor layer. The diffusion barrier material may be disposed in a middle of the active semiconductor layer with respect to the impurities and an upper surface of the active semiconductor layer. However, the location of the diffusion barrier material is not limited thereto. At operation 206, the SOI substrate undergoes an annealing process such that the diffusion barrier material is formed into a diffusion barrier layer, and the method ends. Accordingly, a SOI substrate is formed having a diffusion barrier layer that inhibits the impurities from diffusing therethrough and into an upper portion of the active semiconductor layer.

Figure 21:
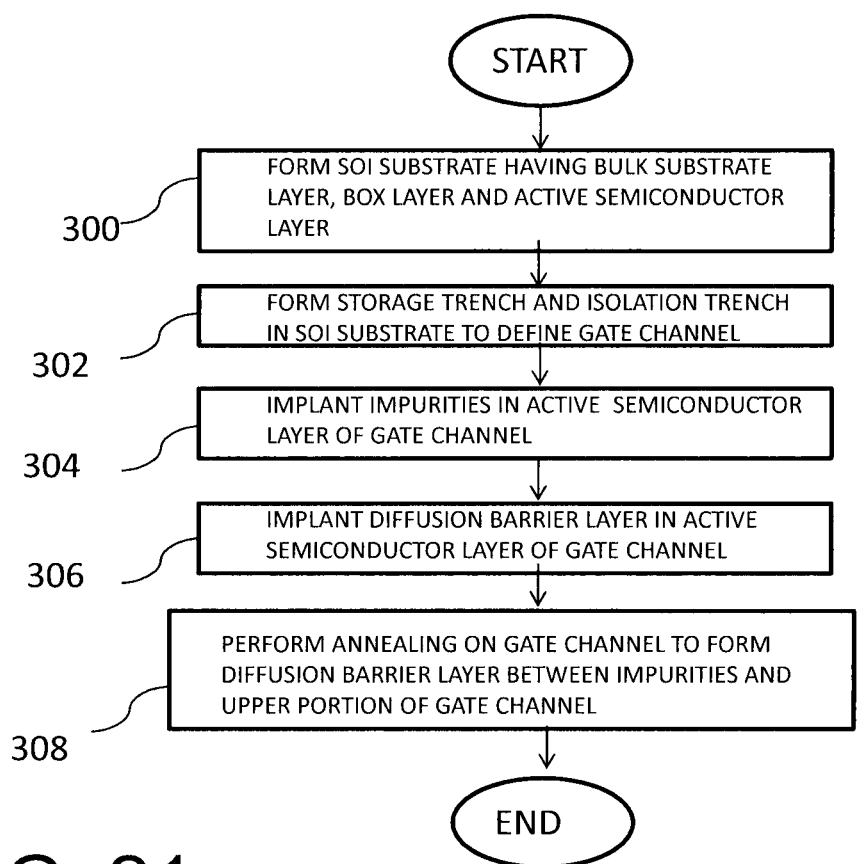
FIG. 21 is flow diagram illustrating a method of fabricating a semiconductor device including a gate channel having impurities and a diffusion barrier layer.

Referring to FIG. 21, a flow diagram illustrates a method of fabricating a semiconductor device including a gate channel having impurities and a diffusion barrier layer. At operation 300, an SOI substrate is formed. The SOI substrate includes a bulk substrate layer, a BOX layer, and an active semiconductor layer formed on the BOX layer. At operation 302, one or more storage trenches and one or more isolation trenches are formed in the SOI substrate. The trenches may be etched into the SOI substrate according to various etching process including, but not limited to, reactive-ion etching (RIE). A gate channel region may be defined between two isolation trenches. At operation 304, impurities are implanted in the active semiconductor layer of the gate channel region. At operation 306, a diffusion barrier material is deposited in the active semiconductor layer of the gate channel region. The diffusion barrier material is annealed to form a diffusion barrier layer at operation 308. In at least one embodiment of the disclosure, the diffusion barrier layer is disposed between the impurities and an upper portion of the gate channel region such that the impurities are inhibited from diffusing into an upper portion of the gate channel region. Therefore, the gate channel region included in the SOI substrate according to at least one embodiment of the disclosure may realize a reduction in current leakage.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or operations described therein without departing from the spirit of the subject matter of the disclosure. For instance, operations may be performed in a differing order. Additionally, operations may be added, deleted or modified. All of these variations are considered within the scope of the claims.

While various embodiments have been described, it will be understood that those skilled in the art, both now and in the future, may make various modifications to the embodiments which fall within the scope of the following claims. These claims should be construed to maintain the proper protection of the subject matter recited therein.

The invention claimed is:

1. A semiconductor memory device, comprising:
a semiconductor-on-insulator (SOI) substrate including an active semiconductor layer formed on a buried insulator layer;
a semiconductor device formed on the SOI substrate, the semiconductor device including a channel region formed between a source region and a drain region;
at least one storage element formed adjacent the channel region;
at least one isolation region disposed between the channel region and the at least one storage element;
impurities disposed within the active semiconductor layer of the channel region; and
a diffusion barrier layer formed in the active semiconductor layer, the diffusion barrier layer disposed between the impurities and an upper surface of the channel region to increase a voltage threshold at a leakage region shared by the buried insulator layer, the channel region, and the at least one isolation region; and
a gate formed directly over the channel region containing the impurities and above the diffusion barrier layer such that the impurities are contained in the channel region without extending beyond the channel region.

2. The semiconductor device of claim 1, wherein the impurities include atoms selected from a group including boron, boron difluoride, indium, gallium, arsenic and phosphorus, and the diffusion barrier layer comprises a material selected from a group including nitrogen and carbon.

3. The semiconductor device of claim 2, wherein the semiconductor device is a field effect transistor included in an eDRAM device.

4. A semiconductor-on-insulator (SOI) substrate, comprising:
a bulk semiconductor substrate;
a buried insulator layer formed on the bulk substrate;
a semiconductor device formed on the SOI substrate, the semiconductor device including a channel region formed between a source region and a drain region;
at least one storage element formed adjacent the channel region;
at least one isolation region disposed between the channel region and the at least one storage element;
an active semiconductor layer disposed on the buried insulator layer;
a layer of impurities formed within the active semiconductor layer;
a diffusion barrier layer formed between the impurities and an upper surface of the active semiconductor layer, the diffusion barrier layer blocking the impurities from diffusing therethrough; and
a gate formed directly over the channel region containing the impurities and above the diffusion barrier layer such that the impurities are contained in the channel region without extending beyond the channel region.

5. The (SOI) substrate of claim 4, wherein the impurities comprise atoms selected from a group comprising boron, boron difluoride, indium, gallium, arsenic and phosphorus.

6. The (SOI) substrate of claim 5, wherein the diffusion barrier layer comprises material selected from a group comprising nitrogen and carbon.

7. The (SOI) substrate of claim 6, wherein the diffusion barrier layer comprises a material including combination of at least one of indium and gallium and at least one of nitrogen and carbon.

8. The (SOI) substrate of claim 7, wherein the diffusion barrier layer comprises at least one of germanium and xenon.

* * * * *